United States Patent [19]

Scobey

[11] Patent Number: 5,583,683
[45] Date of Patent: Dec. 10, 1996

[54] OPTICAL MULTIPLEXING DEVICE

[75] Inventor: Michael A. Scobey, Marlborough, Mass.

[73] Assignee: Optical Corporation of America, Marlborough, Mass.

[21] Appl. No.: 490,829

[22] Filed: Jun. 15, 1995

[51] Int. Cl.⁶ .............................. H04J 14/02; G02B 5/28
[52] U.S. Cl. ...................... 359/127; 359/129; 359/133; 359/589; 359/587
[58] Field of Search .................................. 359/115, 124, 359/129, 130, 127, 131, 133, 580, 583, 587, 589, 615, 634, 722, 723; 385/24

[56] References Cited

U.S. PATENT DOCUMENTS

| | | | |
|---|---|---|---|
| 4,111,524 | 9/1978 | Tomlinson, III | 359/129 |
| 4,315,666 | 2/1982 | Hicks, Jr. . | |
| 4,474,424 | 10/1984 | Wagner . | |
| 4,634,218 | 1/1987 | Hicks, Jr. . | |
| 4,671,613 | 6/1987 | Buhrer . | |
| 4,675,860 | 6/1987 | Laude et al. | 359/129 |

(List continued on next page.)

FOREIGN PATENT DOCUMENTS

| | | |
|---|---|---|
| 0512541 | 7/1992 | European Pat. Off. . |
| 3546082 | 12/1985 | Germany . |
| 5717907 | 1/1982 | Japan . |
| 4-56829 | 2/1992 | Japan . |
| 4145800 | 5/1992 | Japan . |

OTHER PUBLICATIONS

Multireflection Optical Multi/Demultiplexers using interference filters, Clarricoats, Progress in optical communications, 1980 pp. 183–184.

*Primary Examiner*—Wellington Chin
*Assistant Examiner*—Rafael Bacares
*Attorney, Agent, or Firm*—Banner & Witcoff, Ltd.

[57] ABSTRACT

An optical multiplexing device spatially disburses collimated light from a fiber optic waveguide into individual wavelength bands, or multiplexes such individual wavelength bands to a common fiber optic waveguide or other destination. The optical multiplexing device has application for dense channel wavelength division multiplexing (WDM) systems for fiber optic telecommunications, as well as compact optical instrument design. Multiple wavelength light traveling in a fiber optic waveguide is separated into multiple narrow spectral bands directed to individual fiber optic carriers or detectors. An optical block has an optical port for passing the aforesaid multiple wavelength collimated light, and multiple ports arrayed in spaced relation to each other along a multiport surface of the optical block. A continuous, variable thickness, multi-cavity interference filter extends on the multiport surface of the optical block over the aforesaid multiple ports. At each of the multiple ports the continuous interference filter transmits a different wavelength sub-range of the multiple wavelength collimated light passed by the optical port, and reflects other wavelengths. Multicolor light passed to the optical block from the optical port is directed to a first one of the multiple ports on an opposite surface of the optical block. The wavelength sub-range which is "in-band" of such first one of the multiple ports is transmitted through that port by the local portion of the continuous, variable thickness interference filter there, and all other wavelengths are reflected. The light not transmitted through the first port is reflected to strike a second port, at which a second (different) wavelength band is transmitted and all other light again reflected. The reflected optical signals thus cascades in a "multiple-bounce" sequence down the optical block of the multiplexing device, sequentially removing each channel of the multiplexed signal. In reverse operation, individual channels are combined in the optical block and transmitted through the optical port.

23 Claims, 5 Drawing Sheets

U.S. PATENT DOCUMENTS

| | | | |
|---|---|---|---|
| 4,707,064 | 11/1987 | Dobrowolski | 359/129 |
| 4,743,086 | 5/1988 | Hicks, Jr. . | |
| 4,758,087 | 7/1988 | Hicks, Jr. . | |
| 4,768,849 | 9/1988 | Hicks, Jr. . | |
| 4,773,063 | 9/1988 | Hunsperger et al. | 359/129 |
| 4,911,525 | 3/1990 | Hicks et al. . | |
| 4,922,481 | 5/1990 | Hicks . | |
| 4,935,918 | 6/1990 | Hicks . | |
| 4,957,371 | 9/1990 | Pellicori et al. . | |
| 4,987,567 | 1/1991 | Buhrer . | |
| 5,002,352 | 3/1991 | Bradley et al. . | |
| 5,005,935 | 4/1991 | Kunikane et al. . | |
| 5,048,909 | 9/1991 | Henry et al. . | |
| 5,111,519 | 5/1992 | Mathis . | |
| 5,144,498 | 9/1992 | Vincent | 359/885 |
| 5,157,702 | 10/1992 | Middleton et al. . | |
| 5,172,271 | 12/1992 | Sinclair . | |
| 5,283,845 | 2/1994 | Ip . | |
| 5,521,733 | 5/1996 | Akiyama et al. | 359/127 |

FOREIGN PATENT DOCUMENTS

| | | |
|---|---|---|
| 6258545 | 9/1994 | Japan . |
| 6260728 | 9/1994 | Japan . |
| 2014752 | 1/1979 | United Kingdom . |
| 2096350 | 3/1982 | United Kingdom . |
| 2182163 | 9/1986 | United Kingdom . |
| 8302168 | 6/1983 | WIPO . |
| 3804785 | 6/1988 | WIPO . |

OPTICAL MULTIPLEXING DEVICE

INTRODUCTION

The present invention is directed to an optical multiplexing device which spatially disburses collimated multi-wavelength light from a fiber optic waveguide into individual wavelength bands, each of which can be directed to an individual fiber optic waveguide output line, light detector, etc., or multiplexes such individual wavelength bands to a common fiber optic waveguide or other destination. In certain preferred embodiments, the improved multiplexing devices of the present invention are particularly well suited for dense channel wavelength division multiplexing (DWDM) systems for fiber optic telecommunications systems.

BACKGROUND

While fiber optic cable is finding widespread use for data transmission and other telecommunication applications, the cost of new installed fiber optic cable presents a barrier to increased carrying capacity. Wavelength division multiplexing (WDM) would allow different wavelengths to be carried over a common fiber optic waveguide. Presently preferred wavelength bands for fiber optic transmission media include those centered at 1.3µ and 1.55µ. The latter is especially preferred because of its minimal absorption and the commercial availability of erbium doped fiber amplifiers. It has a useful band width of approximately 10 to 40 nm, depending on application. Wavelength division multiplexing can separate this band width into multiple channels. Ideally, the 1.55µ wavelength band, for example, would be divided into multiple discreet channels, such as 8, 16 or even as many as 32 channels, through a technique referred to as dense channel wavelength division multiplexing (DWDM), as a low cost method of substantially increasing long-haul telecommunication capacity over existing fiber optic transmission lines. Wavelength division multiplexing may be used to supply video-on-demand and other existing or planned multimedia, interactive services. Techniques and devices are required, however, for multiplexing the different discreet carrier wavelengths. That is, the individual optic signals must be combined onto a common fiber optic waveguide and then later separated again into the individual signals or channels at the opposite end of the fiber optic cable. Thus, the ability to effectively combine and then separate individual wavelengths (or wavelength bands) from a broad spectral source is of growing importance to the fiber optic telecommunications field and other fields employing optical instruments.

Optical multiplexers are known for use in spectroscopic analysis equipment and for the combination or separation of optical signals in wavelength division multiplexed fiber optic telecommunications systems. Known devices for this purpose have employed, for example, diffraction gratings, prisms and various types of fixed or tunable filters. Gratings and prisms typically require complicated and bulky alignment systems and have been found to provide poor efficiency and poor stability under changing ambient conditions. Fixed wavelength filters, such as interference coatings, can be made substantially more stable, but transmit only a single wavelength or wavelength band. In this regard, highly improved interference coatings of metal oxide materials, such as niobia and silica, can be produced by commercially known plasma deposition techniques, such as ion assisted electron beam evaporation, ion beam spattering, reactive magnetron sputtering, e.g., as disclosed in U.S. Pat. No. 4,851,095 to Scobey et al. Such coating methods can produce interference cavity filters formed of stacked dielectric optical coatings which are advantageously dense and stable, with low film scatter and low absorption, as well as low sensitivity to temperature changes and ambient humidity. The theoretical spectral performance of a stable, three-cavity filter (tilted 12°) produced using any of such advanced, deposition methods is shown in FIG. 1 of the appended drawings. The spectral profile is seen to be suitable to meet stringent application specifications.

To overcome the aforesaid deficiency of such interference filters, that is, that they transmit only a single wavelength or range of wavelengths, it has been suggested to gang or join together multiple filter units to a common parallelogram prism or other common substrate. Optical filters are joined together, for example, in the multiplexing device of U.K. patent application GB 2,014,752A to separate light of different wavelengths transmitted down a common optical waveguide. At least two transmission filters, each of which transmits light of a different predetermined wavelength and reflects light of other wavelengths, are attached adjacent each other to a transparent dielectric substrate. The optical filters are arranged so that an optical beam is partially transmitted and partially reflected by each optical filter in turn, producing a zigzag light path. Light of a particular wavelength is subtracted or added at each filter (depending upon whether the element is being used as a multiplexer or demultiplexer). Similarly, in the device of European patent application No. 85102054.5 by Oki Electric Industry Co., Ltd., a so-called hybrid optical wavelength division multiplexer-demultiplexer is suggested, wherein multiple separate interference filters of different transmittivities are applied to the side surfaces of a glass block. A somewhat related approach is suggested in U.S. Pat. No. 5,005,935 to Kunikani et al, wherein a wavelength division multiplexing optical transmission system for use in bi-directional optical fiber communications between a central telephone exchange and a subscriber employs multiple separate filter elements applied to various surfaces of a parallelogram prism. Alternative approaches for tapping selective wavelengths from a main trunk line carrying optical signals on a plurality of wavelength bands is suggested, for example, in U.S. Pat. No. 4,768,849 to Hicks, Jr. In that patent, multiple filter taps, each employing dielectric mirrors and lenses for directing optical signals, are shown in an arrangement for removing a series of wavelength bands or channels from a main trunk line.

Applying multiple separate filter elements to the surface of a prism or other optical substrate involves significant disadvantages in assembly cost and complexity. In addition, a significant problem associated with wavelength division multiplexing devices and the like employing multiple discreet interference filter elements, arises from uncertainty as to the precise wavelength of a filter element as it is manufactured. That is, in the manufacture of multiplexing devices, wherein bandpass filter elements are produced separately, a device employing eight individual bandpass filters, for example, typically will require considerably more than eight coating lots to produce the necessary eight suitable filter elements. Bandpass filters (particularly in the infrared range) are extremely thick and require complicated and expensive vacuum deposition equipment and techniques. Accordingly, each coating lot can be expensive and difficult to produce. For this reason, devices employing, for example, eight separate interference filter elements to produce an eight channel WDM device, have been relatively costly and have not enjoyed full commercial acceptance.

Another problem associated with optical multiplexing devices employing multiple individual bandpass filter elements, involves the need to mount the elements in nearly perfect parallelism on an optical substrate. The filter elements are quite small, typically being on the order of 1 to 5 mm in diameter, and are, accordingly, difficult to handle with precision. Improper mounting of the filter elements can significantly decrease the optical accuracy and thermal stability of the device. A related problem is the necessity of an adhesive medium between the filter element and the surface of the optical substrate. The optical signal path travels through the adhesive, with consequent system degradation. In optical multiplexing devices intended for the telecommunications industry, preferably there is as little as possible epoxy adhesive in the optical signal path.

It is an object of the present invention to provide improved optical multiplexing devices which reduce or wholly overcome some or all of the aforesaid difficulties inherent in prior known devices. Particular objects and advantages of the invention will be apparent to those skilled in the art, that is, those who are knowledgeable and experienced in this field of technology, in view of the following disclosure of the invention and detailed description of certain preferred embodiments.

SUMMARY OF THE INVENTION

In accordance with a first aspect, an optical multiplexing device comprises an optical block which may be either a solid optical substrate, such as glass or fused silica or the like, or an enclosed chamber which is hollow, meaning either evacuated or filled with air or other optically transparent medium. The optical block has an optical port for passing multiple wavelength collimated light. Depending upon the application of the optical multiplexing device, such multiple wavelength collimated light may be passed through the optical port into the optical block to be demultiplexed, or from the optical block as a multiplexed signal to a fiber optic transmission line or other destination. Multiple ports are arrayed in spaced relation to each other along a multiport surface of the optical block. As illustrated below in connection with certain preferred embodiments, the optical block may have more than one such multiport surface. Each of these multiple ports is transparent to the optical signal of one channel. Thus, each transmits a wavelength sub-range of the multiple wavelength collimated light passed by the optical port. In an application of the optical multiplexing device in a multi-channel telecommunication system, each of the multiple ports typically would pass a single discreet channel and, in combination, the channels form the aforesaid multiple wavelength collimated light transmitted by the optical port. A continuous, variable thickness interference filter, preferably a multi-cavity interference filter, is carried on the multiport surface of the optical block to provide the aforesaid multiple ports. Because this continuous interference filter extending over the multiport surface has a different optical thickness at each of the multiple ports, the wavelength (or wavelength range) passed by the filter at each such port will differ from that passed at the other ports. Thus, a single film, preferably deposited directly onto the surface of the optical block, separately passes optical signals for each of a number of channels at separate locations, while reflecting other wavelengths. As noted above, the optical block may be either solid or a hollow chamber. In the case of a solid optical block, the multiport surface carrying the continuous, variable thickness interference filter would typically be an exterior surface of the block. As discussed further below, the individual ports of the multiport surface may be bandpass filters, preferably narrow bandpass filters transparent to a wavelength sub-range separated from the sub-range of the next adjacent port(s) by as little as 2 nm or even less for DWDM. Alternatively, some or all of the multiple ports could be dichroic, i.e., a long wavepass or short wavepass edge filter, preferably with a very sharp transition point. The transition point of each port would be set at a slightly (e.g., 2 nm) longer (or shorter) boundary wavelength. In a demultiplexing operation, each port, in turn, would pass or transmit only optic signals in the incremental range beyond the boundary wavelength of the previous port, since all light at shorter (or longer) wavelengths would already have been removed. Light beyond the boundary wavelength of the new port would be reflected, in accordance with the above described principles of operation.

The optical multiplexing device further comprises means for cascading light within the optical block along a multi-point travel path from one to another of the multiple ports. In a demultiplexing operation, the optical signals would enter the optical block at the aforesaid optical port and travel to the multiple ports (acting in this case as output ports) along the aforesaid multi-point travel path. The signal for each individual channel is transmitted out of the optical block at its corresponding port; other wavelength are reflected, or bounced, back to cascade further along the optical travel path within the optical block. It will be understood that at the last output port(s) there may be no remainder light to be reflected. It will also be understood from this disclosure, that the optical multiplexing device can operate in the reverse or both directions. The cascading means preferably comprises a reflective film carried on a second surface of the optical block, either as a continuous coating spanning the multi-point travel path of the cascading light signals, or as multiple discreet reflector elements. The optical block would most typically be rectilinear, having the reflective film on or at a second surface of the optical block opposite and parallel to the multiport surface carrying the aforesaid continuous interference filter. This second film can be a broadband high reflector, that is, a film coating which is highly reflective of all wavelengths of the channels which combine to form the multiple wavelength collimated light, or can act as a second interference filter transparent at spaced locations (i.e., at some or each of the bounce points) to the optical signal of one or more of the channels. In either case, the interference filter and reflective film on spaced surfaces of the optical block operate to cascade optical signals through the optical block in a multiple-bounce sequence starting at (or finishing at) the optical port through which the multiple wavelength collimated light passes. This multiple-bounce cascading will be further described below in connection with certain preferred embodiments.

BRIEF DESCRIPTION OF THE DRAWINGS

Certain preferred embodiments of the invention are discussed below with reference to the accompanying drawings in which.

Figure 1:
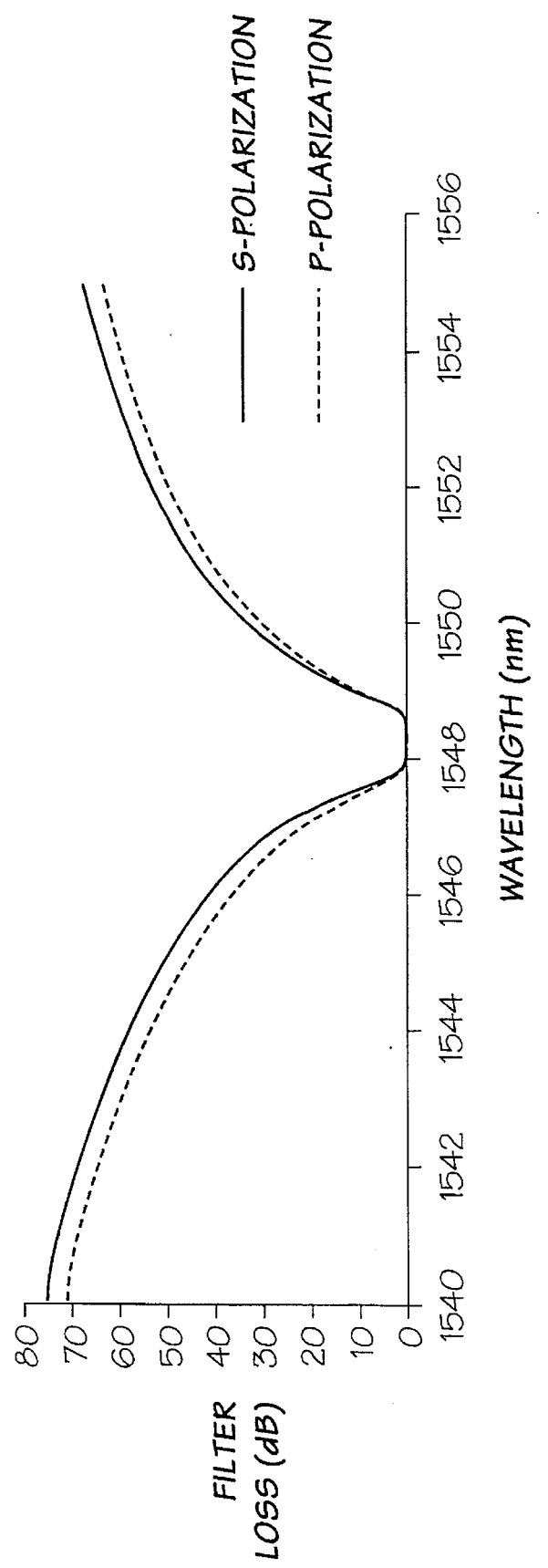
FIG. 1 is a graph showing the theoretical performance of a high quality multi-cavity, dielectric, optical interference filter.

It should be understood that the optical multiplexing devices and interference filter illustrated in the drawings are not necessarily to scale, either in their various dimensions or angular relationships. It will be well within the ability of those skilled in the art to select suitable dimensions and angular relationships for such devices in view of the foregoing disclosure and the following detailed description of preferred embodiments.

DETAILED DESCRIPTION OF CERTAIN PREFERRED EMBODIMENTS

The optical multiplexing device, as disclosed above, has numerous applications including, for example, in fiber optic telecommunication systems. Optical multiplexing devices of this design are particularly useful, for example, in test equipment and the like, as well as laboratory instrumentation. For purposes of illustration, the preferred embodiments described below in detail are dense channel wavelength division multiplexing devices which can solve or reduce the above described problems of individually mounting multiple filter elements to an optical substrate for each individual signal channel, the problems of cost and complexity involved in multiple coating lots for preparing such individual filter elements, and the associated problems of filter wavelength uncertainty.

As discussed below in connection with the appended drawings, a graded wavelength all-dielectric narrow bandpass filter is placed on at least one side of an optical block, preferably a polished parallel plate of specific thickness. The filter, forming a continuous coating over at least a portion of the surface of the optical block, preferably is a multi-cavity, most preferably three cavity, film stack coating modeled after a Fabry-Perot etalon, and may be referred to simply as a cavity filter. Two dielectric thin film stacks which by themselves form a reflector for the optical wavelengths in question, are separated by a thicker cavity layer. This structure is then repeated one or more times to produce a filter with enhanced blocking and improved in-band transmission flatness. The net effect is to produce a narrowband transmissive filter where in-band light is transmitted and out-of-band light is reflected. As noted above, dichroic filters may also be used. This improved filter performance provides commercially acceptable dense channel wavelength division multiplexing for fiber optic telecommunications applications of the optical multiplexing device. It provides low cross-talk between channels and permits a suitably high number of channels within a given band width. An excessive number of cavities will adversely affect the transmissivity of even in-band wavelengths and may increase production costs for the optical multiplexing device beyond commercially acceptable levels.

The continuous, variable thickness, multi-cavity interference filter can be produced with dense, stable metal oxide film stackes using the deposition techniques mentioned above. Such filters have been demonstrated to have excellent thermal stability, e.g., 0.004 nm/°C. at 1550 nm, and ultranarrow band widths, separated by as little as 2 nm, or even as little as 1 nm. Suitable variable thickness filters have been used in other applications such as, for example, in U.S. Pat. 4,957,371 to Pellicori et al. Stable Ultra-Narrowband Filters also are shown in SPIE Proceedings 7/1994. Preferably, the interference filter is continuously linearly variable in thickness. Optionally, however, the thickness of the continuous filter may be variable non-continuously for example, having a substantially uniform thickness over each of the multiple ports of the optical block associated with the separate channels of the fiber optic system.

The interference filter typically comprises two materials, one of a high refractive index such as niobium pentoxide, titanium dioxide, tantalum pentoxide and/or mixtures thereof e.g., niobia and titania, etc. At 1.5 microns wavelength, the refractive index value for these materials is roughly 2.1 to 2.3. The low refractive index material is typically silica, having a refractive index of about 1.43. An interference filter has an "optical thickness" which is the numerical product of its physical thickness times its refractive index. The optical thickness of the continuous, variable thickness, multi-cavity interference filters used in the optical multiplexing devices disclosed here varies, of course, with the physical thickness of the filter at various points along the surface of the optical block. At each of the multiple ports of the optical block associated with an individual signal channel, the optical thickness of the interference filter is tuned to transmit the desired wavelength sub-range(s). It will be apparent to those skilled in the art in view of this disclosure that the thickness and composition of the layers of the continuous filter can be selected to suit the spectral profile required for any given application of the optical multiplexing device. It will be apparent also, that the continuous filter can be continuously variable in its thickness, linearly or otherwise, or discontinuously variable in its thickness. In certain preferred embodiments, the thickness of the filter at each port is substantially constant, increasing (or decreasing) in thickness only between one port and the next.

The continuous, variable thickness, multi-cavity interference filters used in the optical multiplexing devices disclosed here have many advantages over prior known filtering devices. They can be produced to coat the entire operative portion of a surface of the optical block in a single coating step, tunable at each "bounce point" (e.g., by appropriate placement of associated lens apparatus, collimeters, etc.) to exact wavelengths of ±0.1 nm. When manufactured with durable materials to form dense layers of near unity packing density, they are stable over time and with respect to humidity. A large number of optical blocks can be coated simultaneously with the interference filters in a single coating run, thereby substantially reducing the cost of the optical multiplexing device. They are readily manufactured comprising multiple cavities, which are coherently coupled using a quarter wave thickness layer in accordance with known techniques. The effect of using multiple cavities, as described above, is to produce a filter with an increased slope of the spectral skirts, along with a wider transmission zone. As described above, both of these effects offer advantages over other types of filtering devices, such as etalons and diffraction gratings. Since the filters can be formed by deposition directly onto a surface of the optical block, no epoxy need be used in the mounting of the filter so as to be in the path traveled by the optical signals. The stability of the filter is enhanced, since it is formed on the optical block, and need not be positioned and aligned in a separate mounting operation. As noted above, the center wavelength for each of the multiple signal channels can be tuned by simply moving a GRIN lens collimator or the like associated with each of the signal channels a slight measure in the direction of the varying thickness of the continuous filter. By so moving the associated lens apparatus, it is aligned with the desired signal wavelength. In this fashion the uncertainty of achieving the correct center wavelength in the manufacture of discreet filter elements is substantially overcome.

A dense channel wavelength division multiplexing device is illustrated in FIG. 1, employing a continuous, variable thickness, multi-cavity interference filter to form an ultra-narrow bandpass filter at each of eight separate ports on an optical block. This multiplexing device has the ability to multiplex individual, separate wavelength signals into a common fiber optic carrier line and/or to demultiplex such signals. For simplicity of explanation, only the demultiplexing functionality is described here in detail, since those skilled in the art will readily understand the correlative multiplexing functionality. That is, those skilled in the art will recognize that the same device can be employed in reverse to multiplex optical signals from the individual channels. Typical specifications for an optical multiplexing device in accordance with the preferred embodiment illustrated in FIG. 2 include those provided in Table A.

TABLE A

| | |
|---|---|
| Number of Channels | 8 |
| Channel wavelength | 1544–1560 |
| Channel spacing | 2 nm ± 0.2 nm |
| Minimum Isolation | 20 dB to 35 dB |
| Insertion loss (total) | less than 6 dB |
| Fiber type | single mode, 1 meter pigtail |
| Operating temperature range | −20° C. to +50° C. |

Figure 2:
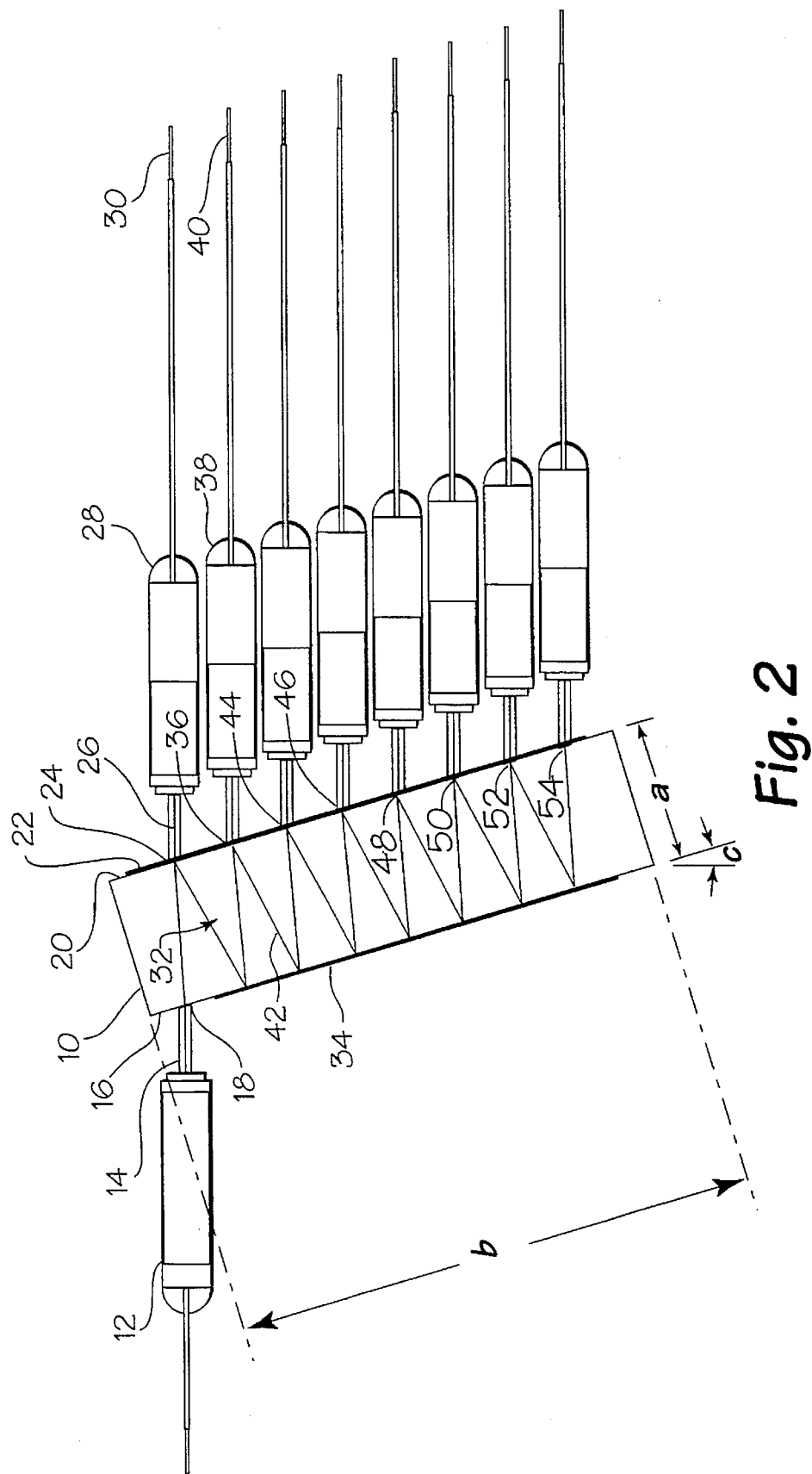
FIG. 2 is a schematic illustration of a first preferred embodiment of an optical multiplexing device, specifically, a dense channel wavelength division multiplexing device for an eight channel fiber optic telecommunications system or like application.

The optical multiplexing device of FIG. 2 meeting the specifications of Table A, is seen to include an optical block 10 which, preferably, is a stable glass substrate. A means for projecting collimated light, such as a fiber optic GRIN lens collimator 12 or the like, couples highly collimated light 14 to the optical block at a slight angle through a hole or facet in surface 16 of the optical block. In accordance with one preferred embodiment, the optical block has a thickness "a" of 5 mm, and a length "b" of 14.1 mm or more, and a refractive index of about 1.5. The collimated light preferably has a divergence of not more than about 0.15° and the tilt angle "c" at which the collimated light enters the optical block is about 15°. Thus, multicolor or multi-wavelength light carried by an optical fiber (preferably a single mode fiber) carrier is collimated by lens means 12 and directed through an optical port 18 in surface 16 of the optical block 10, from which it passes within the optical block to the opposite surface 20. A graded wavelength all-dielectric narrow bandpass filter 22 is carried on surface 20 of the optical block. Specifically, filter 22 is a continuous, variable thickness, multi-cavity interference filter as described above, and, most preferably, is a continuous linearly variable filter. Light entering the optical block at optical port 18 first strikes opposite surface 20 at output port 24. Filter 22 is transparent at output port 24 to a sub-range of the wavelengths included in the collimated light 14. Specifically, light 26 passes through port 24 of the optical block preferably to a collimating lens means 28 associated with a first signal channel. The optical signal passed by port 24 is thereby transmitted to optical fiber, preferably single mode fiber 30, as a demultiplexed signal.

The continuous filter 22 at port 24 is reflective of wavelengths which are not "in-band" of the filter at that location. This reflected light 32 is reflected from surface 20 of the optical block back to surface 16. Surface 16 carries a broadband high reflector film or coating 34. High reflector film 34 does not cover optical port 18, so as to avoid interfering with the passage of collimated light 14 into the optical block at that location. The reflected light 32 from the first output port 24 is reflected at surface 16 by reflector film 34 back to surface 20 of the optical block. The collimated light 14 enters the optical block at optical port 18 at a tilt angle of about 15°, where it refracts according to Snell's Law to an angle of approximately 9.9° and then bounces between the opposite parallel surfaces 16 and 20 of the optical block. Thus, light 32 is reflected by reflector film 34 to strike surface 20 of the optical block at a second location 36 corresponding to a second output port of the optical block. At the location of output port 36, the continuous, variable thickness, multi-cavity interference filter 22 is transparent to a different wavelength or sub-range of wavelengths than it is at output port 24. For dense channel wavelength division multiplexing applications, the wavelength separation between each of the multiple ports linearly spaced along surface 20 of the optical block is preferably about 2 nm or less. Thus, at outport port 36 an optical signal corresponding to a second channel is transmitted through the filter 22 to a collimating lens 38 and from there to fiber optic carrier 40. As at the first output port 24, the interference filter 22 at output port 36 reflects light which is not in-band at that location. Thus, the remaining portion 42 of the collimated light 14 which first entered the optical block at optical port 18 is reflected back from port 36 to the high reflector 34 on opposite surface 16 of the optical block, and from there it is reflected or bounced back to a third output port 44. In similar fashion, the reflected wavelengths then continue to cascade in a zigzag or "multiple-bounce" path down the optical block, with the optical signal for each individual channel being removed by successive bounces at surface 20 of the optical block.

As seen in FIG. 2, therefore, the zigzag path of light travel through optical block 10 causes the reflected wavelengths to strike, in turn, the additional downstream output ports 46, 48, 50, 52 and 54. At each of these multiple ports, the demultiplexed optical signal is passed to an associated collimating lens, each communicating with a corresponding signal carder line or other destination. While preferably the filter 22 is reflective of all wavelengths which are not in-band at each of the multiple output ports, in certain applications it would necessarily be reflective only of the wavelengths of optical signals which had not been extracted at upstream output ports, that is, at output ports encountered previously in the multi-bounce cascade sequence. Also, those skilled in the art will understand from this description that the optical multiplexing device of FIG. 2 is equally suitable for use in combining the optical signals of the eight individual channels. Thus, the multiple ports in surface 20 would be input ports and optical port 18 would be an output port. The cascading would then proceed downstream from the bottom (as viewed in FIG. 2) of the optical block toward the top.

For an optical block of 5 mm thickness, as recited above for optical block 10 of FIG. 2, with a tilt angle of 15° leading to a bounce angle of 9.9° within the optical block, the linear spacing of the individual output ports (TAN [9.9]×2 × 5 mm) would be 1.76 mm. Thus, continuous interference filter 22 on surface 20 of the optical block should be at least 14.1 mm in length (8 ×1.76 mm). The total distance traveled by the optical signal associated with the last of the eight channels (5 mm ×8 channels ×2 bounces) would be 80 mm. The total beam spread (80 mm TAN−1[SIN−1][SIN][0.15/1.5]) would be about 0.138 mm. The total loss, therefore, for a 0.5 mm beam would be about 1.9 dB. Accordingly, it will be appreciated by those skilled in the art that the optical multiplexing device illustrated in FIG. 2 as described above, is suitable to demultiplex numerous individual wavelength channels out of an incident lightbeam in a very efficient manner due to the minimal beam divergence incurred. The total beam spreading for the preferred embodiment described above would be approximately 40% for a half millimeter beam, which produces the aforesaid loss of only 1.9 dB or less than 0.25 dB per channel cascaded through the device. More specifically, those skilled in the art will recognize that the multiple-bounce cascading technique achieved with a continuous, variable thickness, multi-cavity interference filter deposited directly on the surface of an optical block provides an optical multiplexing device having performance characteristics, including cost and simplicity of construction, reliability of performance, compactness, etc., which are significantly improved over prior known devices.

Figure 3:
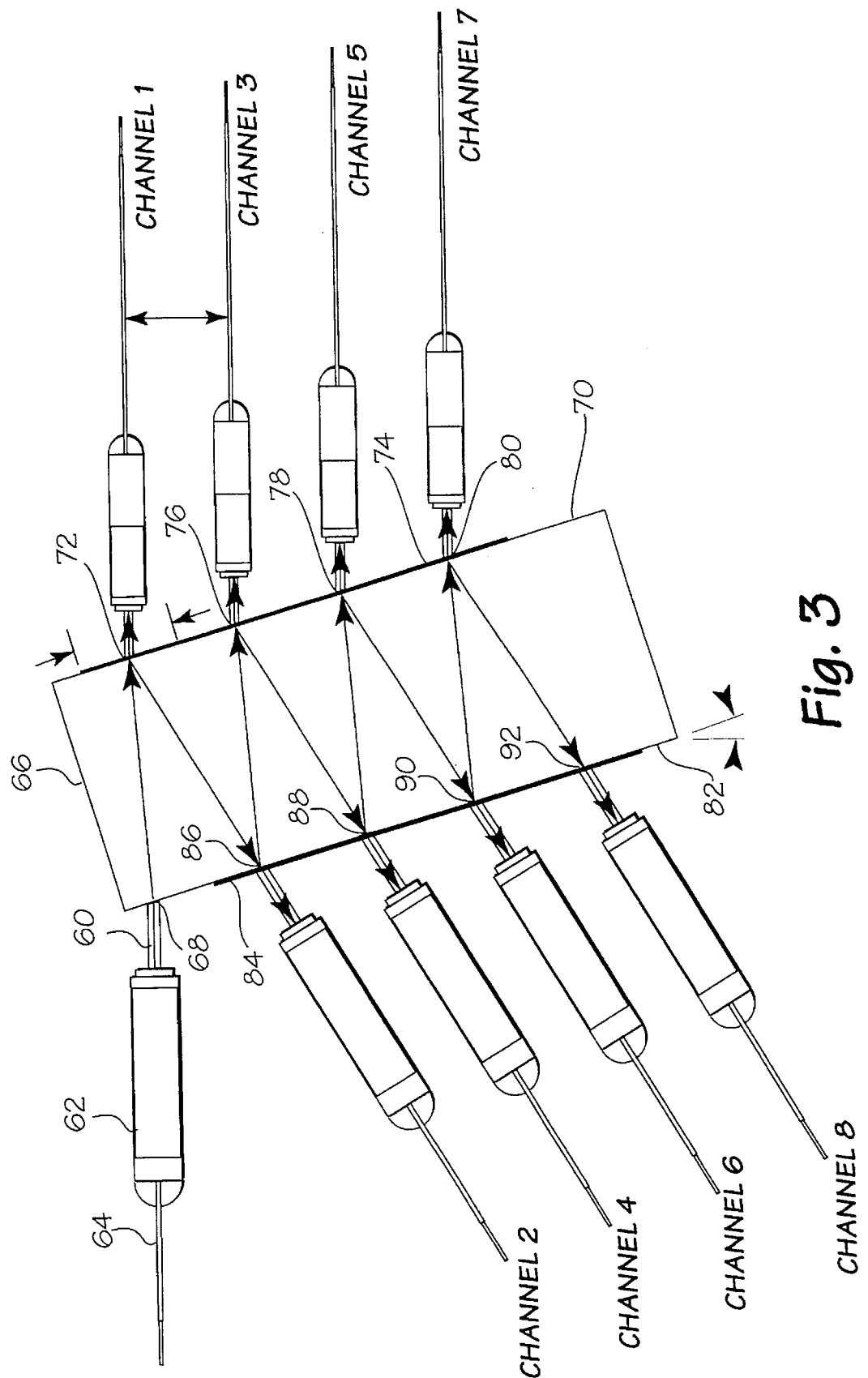
FIG. 3 is a schematic illustration of an alternative preferred embodiment of an optical multiplexing device in accordance with the invention, specifically, a dense channel wavelength division multiplexing device for an eight channel fiber optic telecommunications system or like application.

In the alternative preferred embodiment illustrated in FIG. 3, collimated light 60 from a lens arrangement 62 communicating with a single mode optical fiber 64 passes into optical block 66 at optical port 68 substantially in accordance with the embodiment of FIG. 2 described above. Thus, the light passes through optical block 66 to the opposite, multi-port surface 70 of the optical block, striking it first at output port 72. A continuous, variable thickness, multi-cavity interference filter 74 extends over surface 70 to provide a narrow bandpass filter at each of the multiple output ports 72, 76, 78 and 80. As in the embodiment of FIG. 2, the filter 74 is transparent to a different wavelength at each such port, whereby the single optical signal associated with channels 1, 3, 5 and 7, respectively, are transmitted to corresponding lens apparatus and fiber optic waveguides. On surface 82 of the optical block, a reflective film 84 is provided to cooperate with interference filter 74 on surface 70 to achieve the multi-bounce cascading within the optical block. In accordance with this preferred embodiment, however, reflective film 84 also forms a narrowband filter at each bounce location. Thus, each bounce location at surface 82 of the optical block is an additional output port at which the optical signal associated with an additional channel is passed to an associated lens arrangement and fiber optic carrier line. More specifically, reflective film 84, which preferably is also a continuous, variable thickness, multi-cavity interference filter, and most preferably a continuously linearly variable interference filter, is transparent to the wavelength of the optical signal of channel 2 at output port 86 and reflective of the other wavelengths. Similarly, it is transparent to the optical signal of channel 4 at output port 88 and, again, reflective at that location to other wavelengths. Output port 90 is transparent to the optical signal of channel 6 and, finally, output port 92 is transparent to the optical signal of channel 8.

It will be recognized by those skilled in the art that the optical multiplexing device illustrated in FIG. 3 can provide highly efficient and compact multiplexing and demultiplexing functionality. For collimated light having a divergence of 0.15° and entering optical port 68 at a tilt angle of about 12°, the optical block may advantageously be formed of fused silica and have a width of about 10.361 mm. Linear spacing of the output ports on each of surfaces 70 and 82 is preferably about 3.067 mm, yielding an overall linear dimension of approximately 15 to 20 mm for the optical block. Generally, it is preferred in devices of the type discussed here, to have a low entry angle or tilt angle (where zero degrees would be normal to the surface of the optical block) at which light passes through the optical port (measuring the angle of the light outside the optical block). A low entry angle reduces polarization dependent effects. It also reduces adverse effects of collimated light divergence on filter performance, since a lower entry angle results in more closely spaced bounce points within the optical block and a shorter travel path for the light. Typically, the entry angle is less than 30°, being preferably from 4° to 15°more preferably 6° to 10°, most preferably about 8°.

Figure 4:
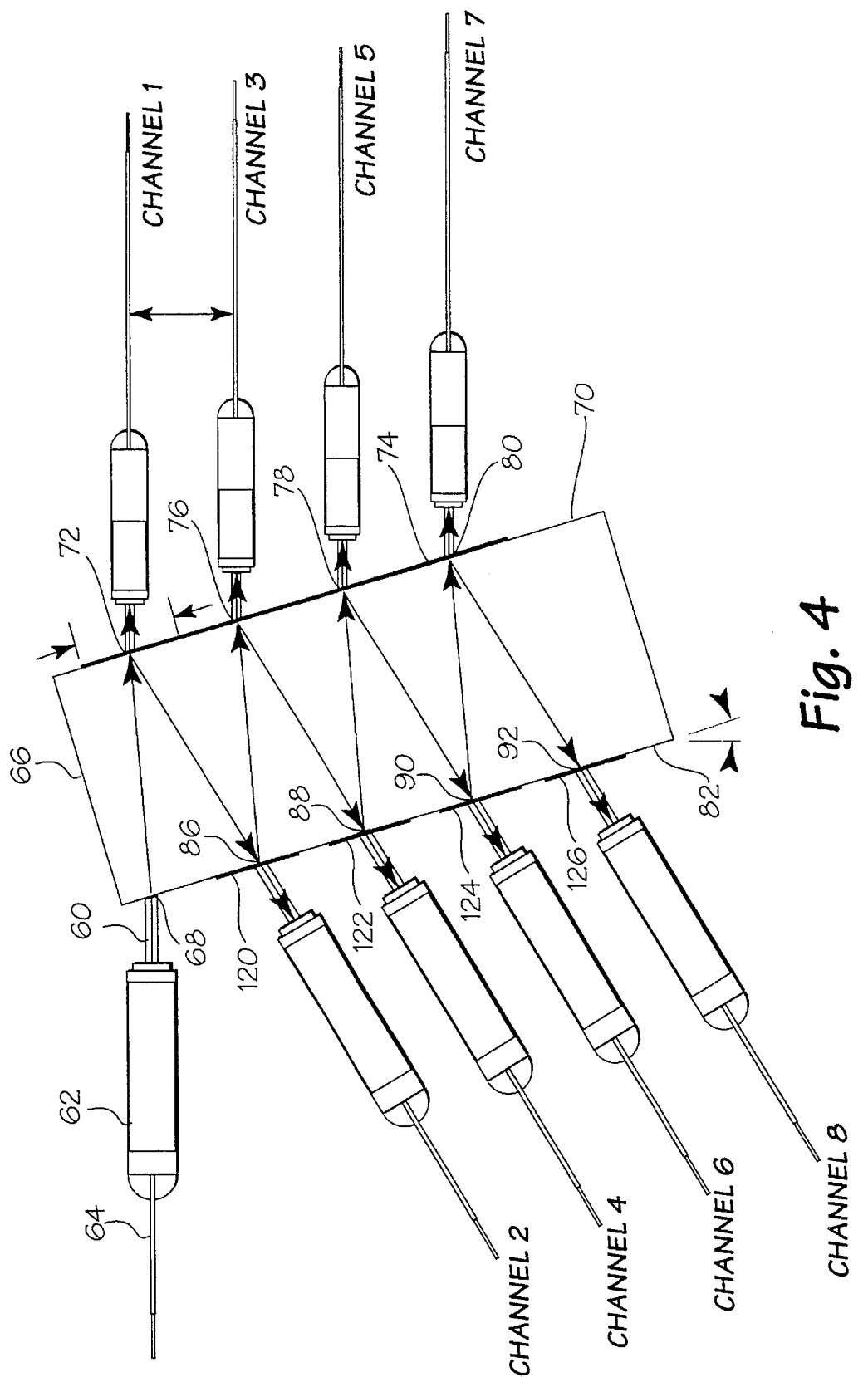
FIG. 4 is a schematic illustration of another alternative preferred embodiment of an optical multiplexing device in accordance with the invention, specifically, a dense channel wavelength division multiplexing device for an eight channel fiber optic telecommunications system or like application.

FIG. 4 illustrates another preferred embodiment, wherein the reflective film on the second surface 82 of the optical block 66 comprises multiple separate elements 120–126. The other features and elements are the same as the corresponding features and elements of the embodiment of FIG. 3, and are given the same reference numbers. The individual reflective film elements 120–126 can be deposited, e.g., by a sputtering process or the like, directly onto the surface 82 of the optical block or onto separate carrier substrates to be individually positioned and attached to the optical block.

Epoxy or other adhesive may be used to attach the reflector elements. The individual reflector films can be broadband reflectors, operating substantially as reflector film 34 in the embodiment of FIG. 1. Alternatively, they may operate as multiple additional ports, i.e., as bandpass filters or dichroic filters substantially in accordance with the principles of reflective film 84 of the optical multiplexing device of FIG. 3.

Additional alternative embodiments will be apparent to those skilled in the art in view of this disclosure, including, for example, optical multiplexing devices wherein two (or more) solid optical substrates are coated, one or both (or all) with continuous, variable thickness interference filters to form multiple ports on a single mono-planer surface as illustrated and described above, and then joined together to form the optical block.

Figure 5:
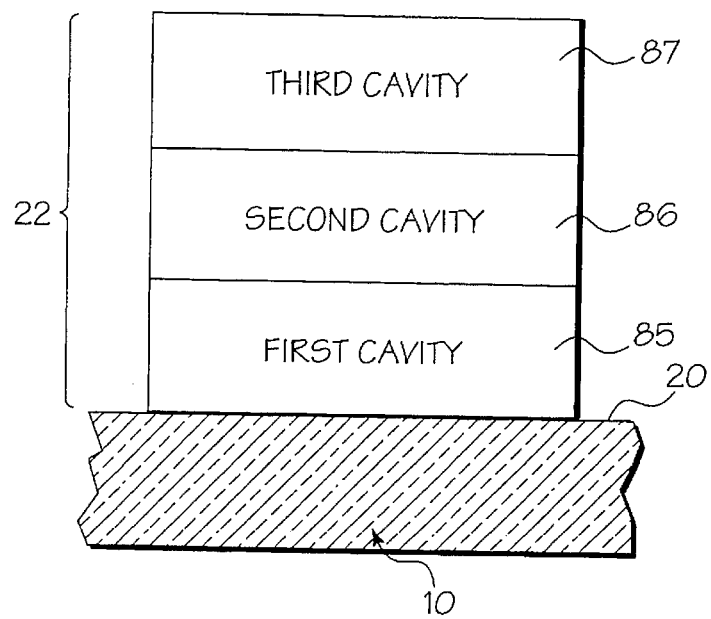
FIGS. 5 and 6 are schematic illustrations, in cross-section, of the continuous, variable thickness, three cavity interference filter of the optical multiplexing device of FIG. 2.
Figure 6:
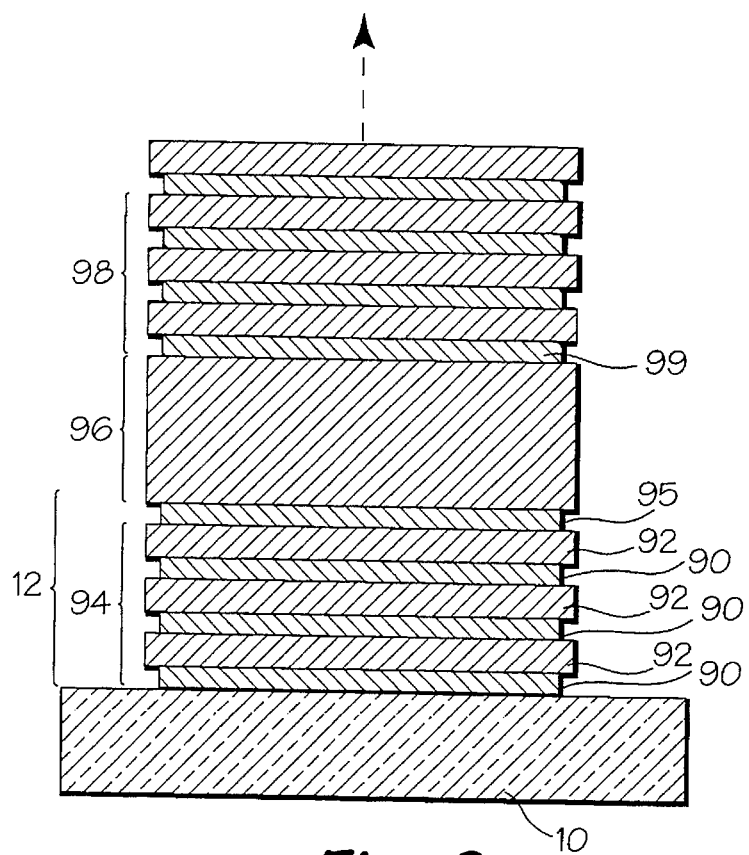

The film stack structure for the continuous, variable thickness, multi-cavity interference filter 22 in the preferred embodiment illustrated in FIG. 2 is illustrated in FIG. 4 and 5. Preferably, the thickness of each alternating layer (for example, of niobium pentoxide and silicon dioxide), as well as the total thickness of the film stack, is precisely controlled, most preferably within 0.01% or 0.2 nm over several square inches of area. In addition, the film stack should be deposited with very low film absorption and scatter, and with a bulk density near unity to prevent water-induced filter shifting. Such ultra-narrow, multi-cavity bandpass filters have excellent performance characteristics including: temperature and environmental stability; narrow bandwidth; high transmittance of the desired optical signal and high reflectance of other wavelengths; steep edges, that is, highly selective transmissivity (particularly in designs employing three cavities or more); and relatively low cost and simple construction. As shown in FIG. 4, the filter is a three cavity filter, wherein one cavity, the "first cavity," is immediately adjacent the glass substrate. A second cavity immediately overlies the first cavity and the third cavity immediately overlies the second cavity and, typically, is exposed to the ambient atmosphere. In FIG. 5 the structure of the "first cavity" is further illustrated. A sequence of alternating layers of high and low index materials are deposited. Preferably, the first layer immediately adjacent the glass surface is a layer of high index material, followed by a layer of low index material, etc. Each of the high index layers 90 is one quarter wave optical thickness (QWOT) or three quarter waves or other odd number of QWOTs. The low refractive index layers 92 which are interleaved with the high refractive index layers 90 are similarly one quarter wave optical thickness or other odd number of QWOTs in thickness. Preferably there are about six sets of high and low layers, forming the bottom-most dielectric reflector 94. A one QWOT thick layer 95 of high refractive index material separates dielectric reflector 94 from cavity spacer 96. Cavity spacer 96 typically comprises 10 to 20 alternating layers of high and low index materials, wherein each of the layers is an even number of QWOTs in thickness. The second dielectric reflector 98 preferably is substantially identical to dielectric reflector 94 described above. The second and third cavities are deposited, in turn, immediately upon the first cavity and preferably are substantially identical in form. The thickness of the interference filter layers varies along the length of the multi-port surface of the optical block, as described above. Thus, the physical thickness of a QWOT will vary along the multi-port surface. Various alternative suitable film stack structures are possible, and will be apparent to those skilled in the art in view of this disclosure.

It will be apparent from the above discussion that various additions and modifications can be made to the optical multiplexing devices described here in detail, without departing from the true scope and spirit of this invention. All such modifications and additions are intended to be covered by the following claims.

I claim:

1. An optical multiplexing device comprising an optical block having an optical port transparent to multiple wavelength collimated light, a continuous, variable thickness interference filter extending on a multiport surface of the optical block and forming multiple ports arrayed in spaced relation to each other along the multiport surface, the continuous, variable thickness interference filter being transparent at each of the multiple ports to a different wavelength sub-range of the multiple wavelength collimated light and reflective of other wavelengths thereof, and means for cascading light along a multi-point travel path from one to another of the multiple ports.

2. The optical multiplexing device in accordance with claim 1 wherein the interference filter is continuously variable.

3. The optical multiplexing device in accordance with claim 1 wherein the interference filter is continuously linearly variable.

4. The optical multiplexing device in accordance with claim 1 wherein the means for cascading light comprises a reflective coating on a second surface of the optical block.

5. The optical multiplexing device in accordance with claim 4 wherein the second surface of the optical block is spaced from and substantially parallel to the multiport surface.

6. The optical multiplexing device in accordance with claim 4 wherein the reflective coating is continuous over the second surface, being at least co-extensive with said multi-point travel path.

7. The optical multiplexing device in accordance with claim 6 wherein the reflective coating is a broadband high reflector film coating which is substantially uniformly reflective of all of said sub-ranges of the multiple wavelength collimated light.

8. The optical multiplexing device in accordance with claim 6 wherein the reflective coating forms multiple additional ports arrayed in spaced relation to each other along the second surface, the reflective coating being transparent at each of the multiple additional ports to a different wavelength sub-range of the multiple wavelength collimated light, and reflective of other wavelengths thereof.

9. The optical multiplexing device of claim 4 wherein the reflective coating comprises multiple discreet reflective film elements arrayed in spaced relation to each other along said second surface.

10. The optical multiplexing device in accordance with claim 4 wherein the means for cascading light further comprises means for directing multiple wavelength collimated light into the optical block through the optical port at an angle to the multiport surface between 4° and 15°.

11. The optical multiplexing device in accordance with claim 1 wherein each one of the multiple ports has an associated lens means for focusing collimated light passed by that one of the multiple ports.

12. The optical multiplexing device in accordance with claim 11 wherein the lens means comprises a GRIN lens communicating with optic fiber.

13. The optical multiplexing device in accordance with claim 1 wherein the optical block comprises a solid block of material substantially transparent to said multiple wavelength collimated light and selected from the group consisting of glass and fused silica, the continuous, variable thickness interference filter being on an outside surface thereof.

14. The optical multiplexing device in accordance with claim 1 wherein the optical block comprises an enclosed chamber.

15. The optical multiplexing device in accordance with claim 1 wherein the optical block is substantially rectilinear, with the optical port being at a front surface of the optical block which is opposite and parallel the multiport surface of the optical block.

16. The optical multiplexing device in accordance with claim 15 wherein (a) the means for cascading light comprises on the front surface a reflective film coating not extending over the optical port; (b) there are at least eight of said multiple ports, each being a bandpass filter transparent to a discreet wavelength sub-range separated from the wavelength sub-range of adjacent ones of the multiple ports by approximately 2 nm; (c) collimated light passes through the optical port at an angle of approximately 6°–10° to the plane of the front surface, and (d) the multiple ports are linearly spaced from one another along the multiport surface.

17. The optical multiplexing device in accordance with claim 16 wherein the reflective film on the front surface of the optical block is a broadband high reflector film coating.

18. The optical multiplexing device in accordance with claim 15 wherein the means for cascading light comprises on the front surface a reflective film coating not extending over the optical port, the reflective film coating being a second continuous, variable thickness interference filter extending on said front surface of the optical block forming multiple additional ports, the second interference filter being transparent at each of the multiple additional ports to a different wavelength sub-range and reflective of other wavelengths of the multiple wavelength collimated light.

19. The optical multiplexing device in accordance with claim 18 wherein (a) there are at least four of said multiple ports and at least four of said multiple additional ports.

20. The optical multiplexing device in accordance with claim 1 wherein the continuous, variable thickness interference filter forms at each one of the multiple ports an all-dielectric narrow bandpass filter.

21. The optical multiplexing device in accordance with claim 1 wherein the continuous, variable thickness interference filter is a multi-cavity interference filter.

22. The optical multiplexing device in accordance with claim 21 wherein the continuous, variable thickness interference filter comprises a film stack forming at least three interference cavities.

23. The optical multiplexing device in accordance with claim 1 wherein the continuous, variable thickness interference filter comprises a film stack formed of alternating films of niobium pentoxide and silicon dioxide.

* * * * *